United States Patent
Zhou et al.

(10) Patent No.: US 10,274,839 B2
(45) Date of Patent: Apr. 30, 2019

(54) TWO-DIMENSIONAL MARKS

(71) Applicant: Taiwan Semiconductor Manufacturing Company, Ltd., Hsin-Chu (TW)

(72) Inventors: Wen-Zhan Zhou, Zhubei (TW); Heng-Jen Lee, Baoshan Township (TW); Chen-Ming Wang, Kaohsiung (TW); Kai-Hsiung Cheng, New Taipei (TW); Chih-Ming Ke, Hsinchu (TW); Ho-Yung David Hwang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 1690 days.

(21) Appl. No.: 13/902,702

(22) Filed: May 24, 2013

(65) Prior Publication Data

US 2014/0253901 A1 Sep. 11, 2014

Related U.S. Application Data

(60) Provisional application No. 61/775,872, filed on Mar. 11, 2013.

(51) Int. Cl.
G03F 7/20 (2006.01)

(52) U.S. Cl.
CPC .......... *G03F 7/70641* (2013.01); *G03F 7/705* (2013.01); *G03F 7/70558* (2013.01)

(58) Field of Classification Search
CPC ... G03B 27/725; G03F 7/705; G03F 7/70558; G03F 7/70641
See application file for complete search history.

(56) References Cited

U.S. PATENT DOCUMENTS

| | | | | |
|---|---|---|---|---|
| 6,414,326 B1* | 7/2002 | Nguyen | ............... | G03F 7/70558 250/492.2 |
| 6,673,638 B1* | 1/2004 | Bendik | ............... | G03F 7/70625 430/30 |
| 7,553,678 B2 | 6/2009 | Zhou et al. | | |
| 7,671,979 B2* | 3/2010 | Smith | ................ | G03F 7/70483 356/124 |
| 8,741,511 B1* | 6/2014 | Zhou | ........................ | G03F 1/36 430/30 |
| 9,766,554 B2* | 9/2017 | Chen | ................... | G03F 7/70625 |
| 9,823,574 B2* | 11/2017 | Chen | ................... | G03F 7/70141 |

(Continued)

OTHER PUBLICATIONS

Wenzhan Zhou et al., "Advanced Exposure and Focus Control by Proximity Profile Signature Matching," Proc. of SPIE vol. 6155, pp. 61550H1-61550H-11.

*Primary Examiner* — Deoram Persaud
(74) *Attorney, Agent, or Firm* — Haynes and Boone, LLP (57) ABSTRACT

A method for controlling semiconductor production through use of a Focus Exposure Matrix (FEM) model includes taking measurements of characteristics of a two-dimensional mark formed onto a substrate, the two-dimensional mark including two different patterns along two different cut-lines, and comparing the measurements with a FEM model to determine focus and exposure conditions used to form the two-dimensional mark. The FEM model was created using measurements taken of corresponding two-dimensional marks formed onto a substrate under varying focus and exposure conditions.

20 Claims, 8 Drawing Sheets

(56) References Cited

U.S. PATENT DOCUMENTS

| | | | | |
|---|---|---|---|---|
| 9,841,689 B1* | 12/2017 | Levinski | ............ | G03F 7/70641 |
| 2003/0048458 A1* | 3/2003 | Mieher | ............... | G03F 7/70625 |
| | | | | 356/601 |
| 2007/0031745 A1* | 2/2007 | Ye | ........................ | G03F 7/705 |
| | | | | 430/30 |
| 2008/0153011 A1* | 6/2008 | Yamamoto | ................ | G03F 1/44 |
| | | | | 430/5 |
| 2009/0284722 A1* | 11/2009 | Gabor | ................. | G03F 7/70333 |
| | | | | 355/53 |
| 2011/0249244 A1* | 10/2011 | Leewis | .................. | G03F 7/706 |
| | | | | 355/27 |
| 2012/0331427 A1* | 12/2012 | Tyminski | ................. | G03F 1/70 |
| | | | | 716/52 |
| 2014/0141536 A1* | 5/2014 | Levinski | ............ | G03F 7/70641 |
| | | | | 438/5 |
| 2014/0257761 A1* | 9/2014 | Zhou | .................. | G03F 7/70558 |
| | | | | 703/1 |
| 2015/0309402 A1* | 10/2015 | Levinski | .................. | G03F 1/42 |
| | | | | 356/247 |
| 2015/0338749 A1* | 11/2015 | Hinnen | .................... | G03F 1/44 |
| | | | | 355/55 |

* cited by examiner

TWO-DIMENSIONAL MARKS

PRIORITY DATA

This patent is a non-provisional of U.S. Ser. No. 61/775,872 filed Mar. 11, 2013, the entire disclosure of which is hereby incorporated by reference.

BACKGROUND

As semiconductor fabrication technology advances, the size features formed into semiconductor devices decreases. This makes it more important to control the critical dimensions of the features formed into a semiconductor wafer. Small changes in the critical dimension can cause unacceptable changes to the semiconductor components. Thus, measurement and control techniques are very important to efficient semiconductor fabrication.

Methods for measuring features formed into a semiconductor substrate include optical tools that utilize scatterometry. Scatterometry refers to the process of measuring light spectra to determine the size of periodic structures. Scatterometry can provide information such as pitch, sidewall angles, and line width. Another tool that can be used to measure characteristics of features formed into semiconductor substrates is a scanning electron microscope.

Various conditions may affect the characteristics of features on a substrate. For example, the intensity of light used to expose a photoresist layer affects the characteristics of the feature. The level of intensity of light may be referred to as dosage or exposure. Another condition that affects the characteristics of features is the focus of the photolithography tool. The photolithography tool can be set to focus at varying depths into a photoresist layer.

The combination of both focus and exposure has a significant effect on the overall characteristics of features formed into a substrate. Moreover, the focus and exposure settings of a photolithography tool may drift over time. Thus, it is useful to monitor this drift and make adjustments as necessary to ensure the formation of features with desired characteristics. One effective means of monitoring and controlling the semiconductor fabrication process is to model the relationships between measured characteristics and focus and exposure settings. It is therefore desirable to find effective methods of modeling these relationships.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
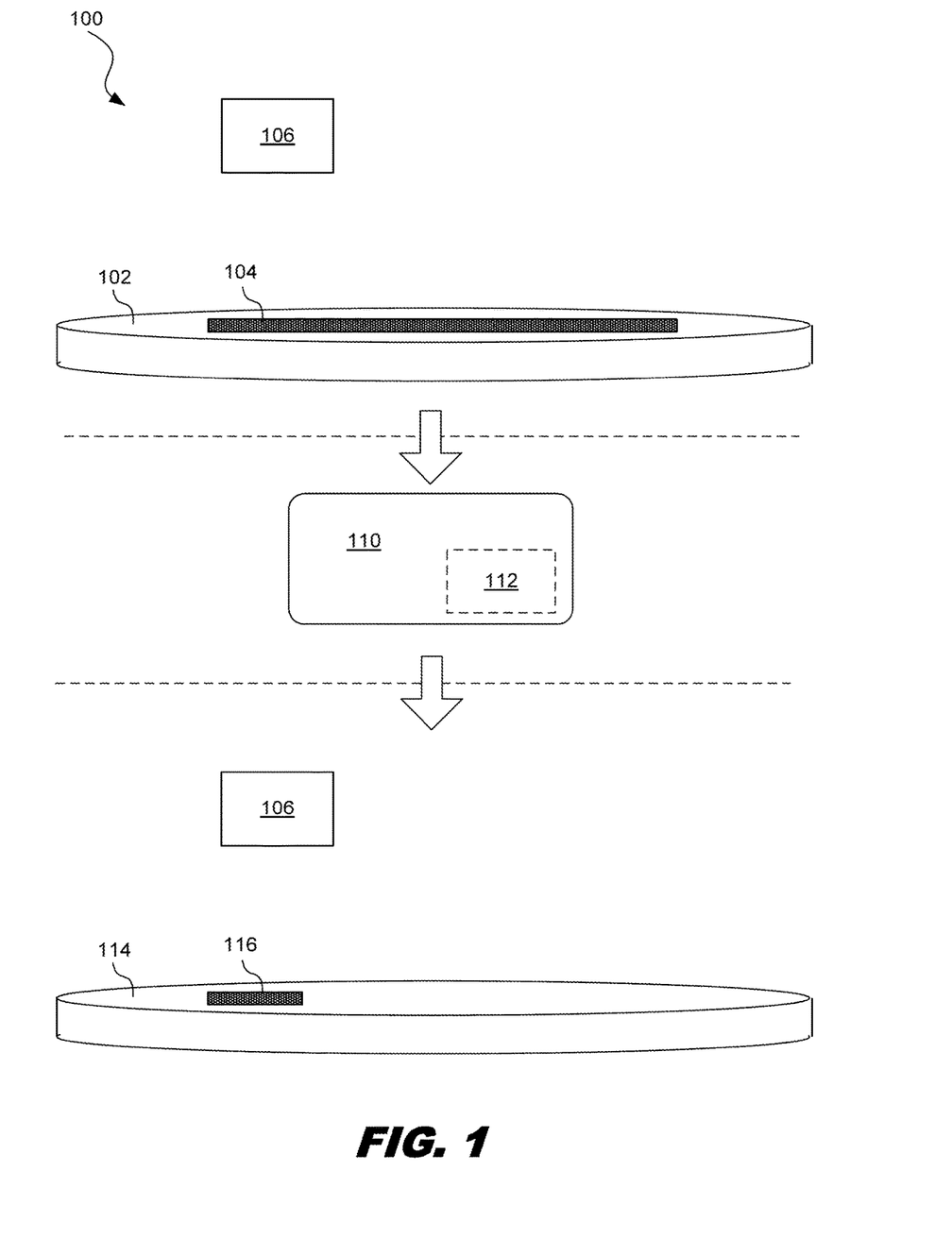
FIG. 1 is a diagram showing an illustrative overview of a process for controlling semiconductor fabrication using a focus-exposure matrix model, according to one example of principles described herein.

FIG. 1 is a diagram showing a process 100 for controlling semiconductor fabrication using a focus-exposure matrix model that is created based on two-dimensional marks. FIG. 1 is meant only to give a brief overview of principles described herein. More detail will be provided below with the text accompanying the remaining figures.

According to certain illustrative examples, a set of two-dimensional test marks 104 are formed onto a semiconductor substrate 102. The substrate 102 may be a standard semiconductor substrate such as a silicon wafer, with or without one or more features formed therein or thereon. The test marks 104 are referred to as two-dimensional test marks because they are designed to be measured along two different dimensions, as will be explained in further detail below.

The set of test marks 104 are formed under varying conditions. Specifically, the test marks are formed with varying exposure levels and focus. In some cases, a photolithography tool that is capable of varying exposure and focus settings at different regions on a substrate may be used. The different exposure and focus levels may be set so that a sufficient dataset of measurements can be achieved. For example, one particular test mark may be formed at a specific exposure level with sub-regions of that test mark being formed at varying focus levels. Other test marks may be formed at different exposure levels, with sub-regions of those test marks being formed at various focus levels.

After being formed, the test marks 104 are measured in order to obtain the dataset used to form a Focus-Exposure Matrix (FEM) model. The marks may be measured by standard equipment. For example, the test marks 104 may be measured by an optical measurement tool 106 such as a scatterometer.

The measurements taken are associated with the focus and exposure conditions with which each sub-region of the test marks 104 was formed. A computing system 110 may be used to aggregate the data and create the FEM model based on the measurements obtained. The FEM model includes measurements taken from multiple cut-lines along the two-dimensional mark. As will be explained further below, this helps the model to be more accurate.

With the model available, a two-dimensional test mark 116 is formed into a subsequent substrate 114. This substrate 114 may be a standard production substrate during normal production operations. Thus, for the purpose of simplifying discussion, this mark will be referred to as the production test mark 116. However, this mark is not necessarily printed onto the substrate during standard production. It is only referred to as a production test mark to distinguish it from the test marks 104 used to create the FEM model 112.

The production test mark 114 is similar to the test marks 104 used to create the model 112. The production test mark 116 can then be measured by the measurement tool 106. The measurements taken of the production test mark 116 can be compared with the FEM model to determine the focus and exposure settings used to create the production mark. Thus, even if the photolithography equipment experiences a drift in focus and exposure, an accurate determination of the focus and exposure settings under which the test mark 116 was formed can be made.

In some cases, the entity forming the model may be a different entity than the one using the model. For example, one entity may develop a comprehensive model and sell or license that model to other entities for use in semiconductor fabrication. Alternatively, the entity that creates the model may be the same entity using the model for semiconductor fabrication purposes.

Figure 2:
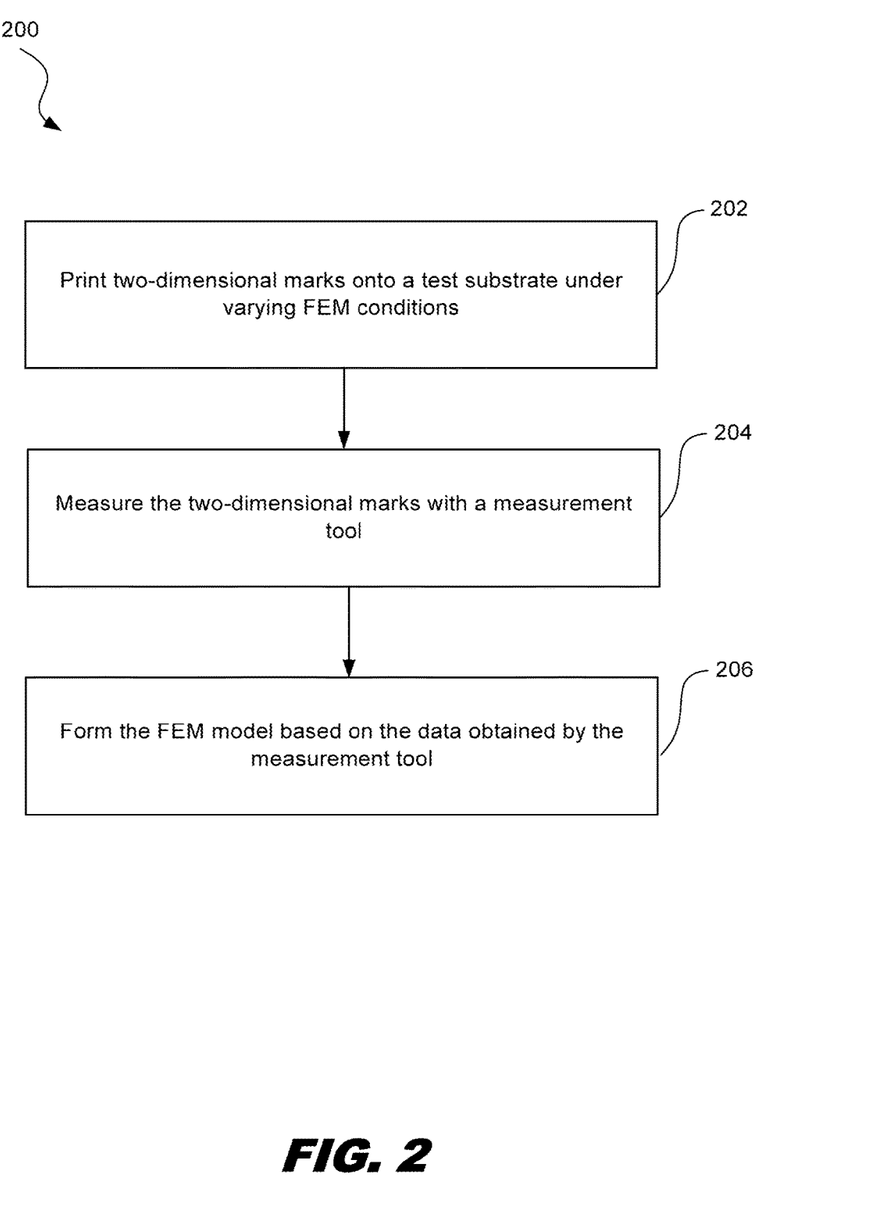
FIG. 2 is a flowchart showing an illustrative method for forming a focus-exposure matrix model from two-dimensional marks, according to one example of principles described herein.

FIG. 2 is a flowchart showing an illustrative method 200 for forming a focus-exposure matrix model based on two-dimensional marks. According to certain illustrative examples, a set of two-dimensional marks are formed onto a semiconductor substrate. These marks are formed under varying focus and exposure settings.

As mentioned above, these two-dimensional marks may be measured by an optical measurement tool such as a scatterometer. In some cases, a Critical-Dimension Scanning Electron Microscope (CD-SEM) may be used to measure the two-dimensional marks. The marks may include periodic features such as lines of different densities. The two-dimensional mark is designed so that one density is presented along one cut-line while a second density is printed along a second-cut line. Thus, two distinguishable densities are present within a single two-dimensional mark.

The patterns within the two-dimensional marks are periodic so that they can be measured by the scatterometer. The scatterometer works by measuring the wavelength of incident light. The periodic features act as a grating that will affect the wavelength of incident light. Thus, as the space between the periodic features varies, so will the wavelength of incident light.

The scatterometer can measure a variety of feature characteristics. For example, the scatterometer can measure the side wall angles of the features. As features are formed into semiconductor substrate, the sidewalls are angled due to the etching processes that are used. The angle of the side walls can be determined by measuring the critical dimension at the top of the features and comparing it with the critical dimension measured at the bottom of the features. Other photoresist profile characteristics such as pitch and line width can be determined by the scatterometer.

After all of the two-dimensional marks have been formed onto the substrate, they can be measured by a measurement tool, such as a scatterometer. The marks may be divided up into regions and sub-regions. For example, a particular region may have multiple marks under the same focus levels but varying exposure levels. Other regions may similarly include marks of a particular, yet different, focus level, with sub-regions being formed under varying exposure levels. Thus, the measured two-dimensional marks can be accordingly associated with their respective focus settings, exposure settings, and characteristics (i.e., density).

The method continues by forming 206 a focus-exposure matrix model using the data from the measurements obtained by the measurement tool. This model may consist of a number of data points that form a curve. As will be explained further below, the model may be graphically represented by a number of contour lines on a two dimensional graph, with axes representing focus and exposure.

Figure 3:
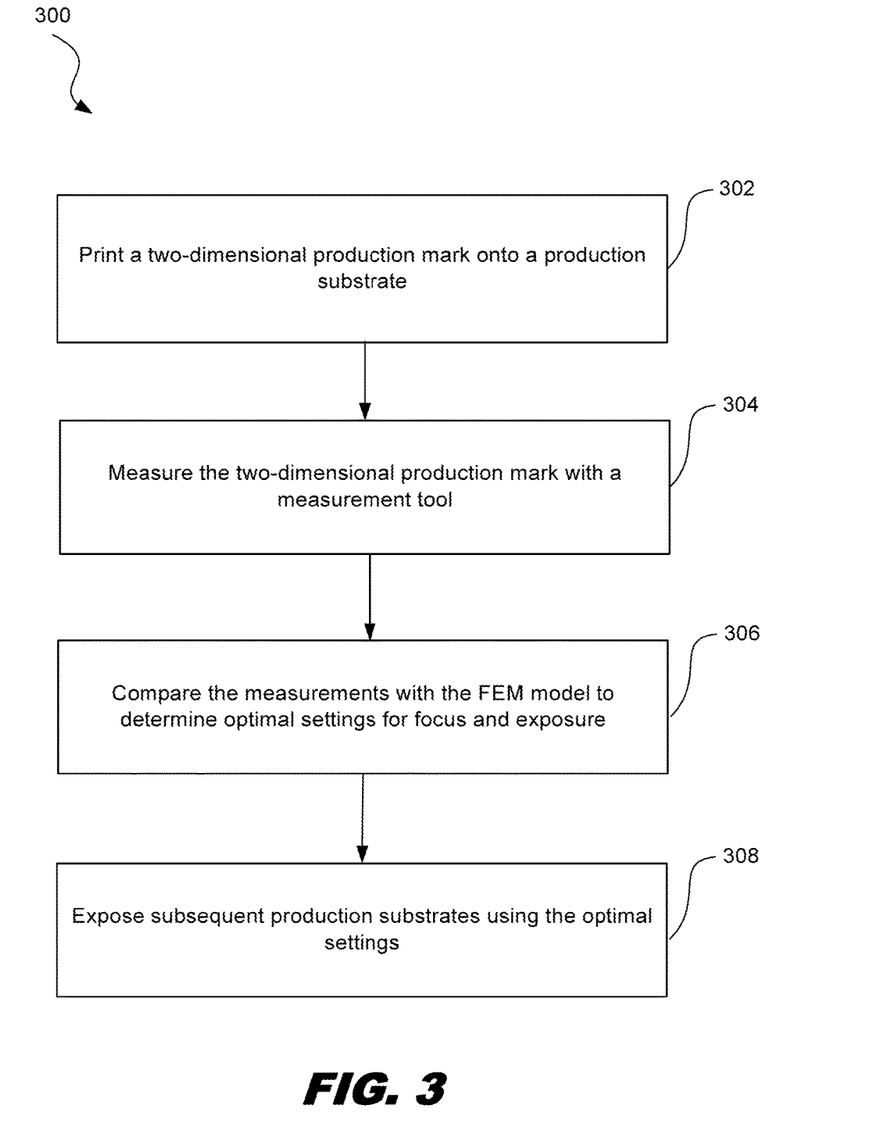
FIG. 3 is a flowchart showing an illustrative method for using the focus-exposure matrix model to control production, according to one example of principles described herein.

FIG. 3 is a flowchart showing an illustrative method 300 for using the FEM model to control production. According to certain illustrative examples, a two-dimensional production mark is printed onto a production substrate. The production substrate may be used for standard production. However, it is not limited to substrates used in production. Rather, the term production substrate is used to distinguish it from the substrate used to create the FEM model.

The production mark has similar characteristics to the marks printed and measured to form the model. The space used to print the production mark is far less than the space used to form the marks used to create the FEM model. This is because multiple copies of the mark is used for various focus and exposure settings to form the model. To make use of the model, however, only a single two-dimensional production mark may be used. This allows most of the standard production substrate to be used for other circuitry for various electronic devices.

The two-dimensional production mark can then be measured 304 with a measurement tool, such as a scatterometer. These measured characteristics can then be compared 306 to the FEM model in order to calculate the focus and exposure settings that were used to create the production mark. For example, if the model indicates that a certain focus and exposure setting combination created a mark having similar measured characteristics of the production mark, then it can be determined that the production mark was created using that same combination of focus and exposure settings.

By comparing the measured characteristics of the production mark with the FEM model, the manner in which the focus and exposure settings of the photolithography tool can be adjusted to achieve optimal characteristics can be determined. In other words, the optimal focus and exposure settings for created features having desired characteristics can be determined. For example, if the focus or exposure settings have drifted, the photolithography tool can be adjusted accordingly to compensate for this drift. The precise adjustment is aided by use of the model.

With the optimal focus and exposure settings obtained, the photolithographic tool can be set accordingly and further production substrates may be exposed 308 using the optimal settings. At various intervals, the two-dimensional production mark may be reprinted on subsequent production substrates in order to determine if another adjustment may be useful. Thus, the production process can be effectively controlled.

Figure 4A:
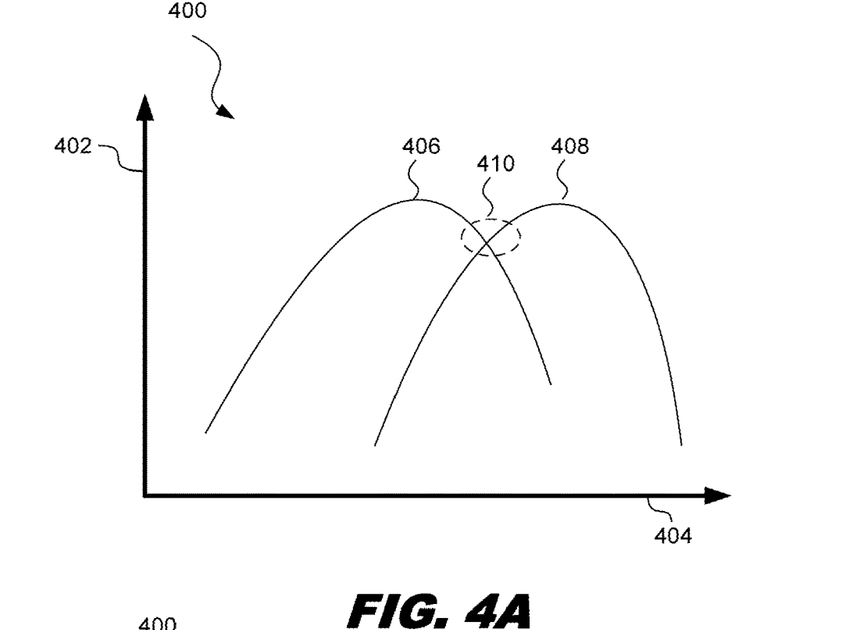
FIG. 4A is a diagram showing an illustrative relationship between focus and exposure for measurements taken with an optical measurement tool, according to one example of principles described herein.

FIG. 4A is a diagram showing an illustrative relationship between focus and exposure for measurements taken with an optical measurement tool. According to the present example, the vertical axis 402 represents exposure levels and the horizontal axis 404 represents focus. Thus, a critical dimension is presented as a contour line along the graph 400.

The optical measurement tool can measure the top critical dimension of a pattern as well as the bottom critical dimension of the pattern. Due to the nature of the photolithography process, these two critical dimensions are different. Specifically, the as a hole or trench is etched into a layer, it becomes narrower. Thus, there will be more space between features at the top of the layer than at the bottom of the layer.

One contour line 406 represents the bottom critical dimension and the other contour line 408 represents the top critical dimension of a pattern. By measuring both the top critical dimension and the bottom critical dimension of the operating features, and comparing those measurements with the model, the focus and exposure settings used to create the operating features can be found. Specifically, the point 410 at which the two lines 406, 408 intersect indicates the approximate settings that were used by the tool that created the operating features. Because the lines are only a calculated representation, they are not necessarily entirely precise. To increase the precision, an additional pattern density may be used.

Figure 4B:
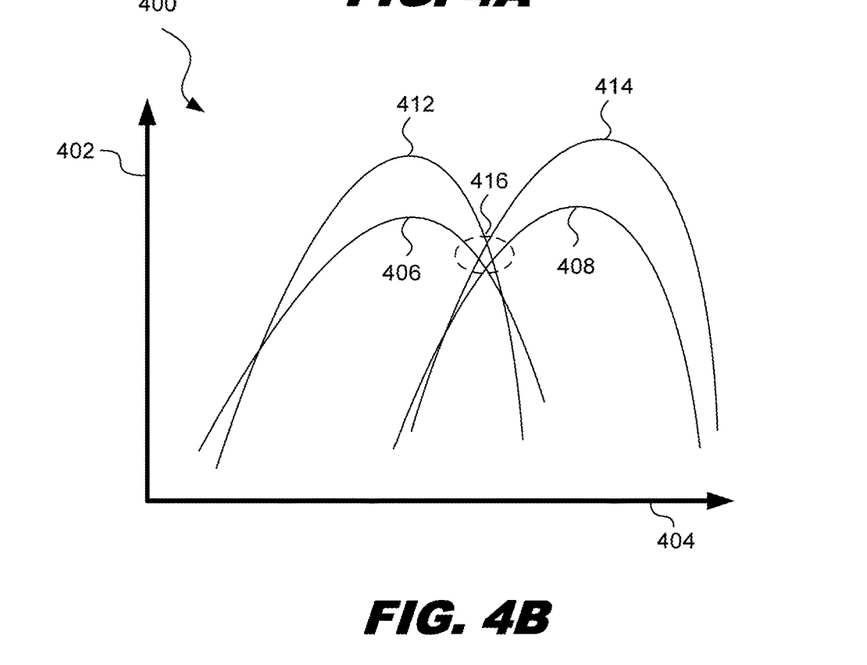
FIG. 4B is a diagram showing an illustrative relationship between focus and exposure for measurements of multiple cut-lines taken with an optical measurement tool, according to one example of principles described herein.

FIG. 4B is a diagram showing an illustrative relationship between focus and exposure for measurements of multiple cut-lines taken with an optical measurement tool. Again, the vertical axis 402 represents exposure levels and the horizontal axis 404 represents focus. Thus, a critical dimension is presented as a contour line along the graph 420.

According to the present example, the top critical dimension and bottom critical dimension of two different patterns are illustrated. Specifically, in addition to the pattern illustrated in FIG. 4A, a second pattern is shown. The second pattern also includes a measurement of the top critical dimension 412, and the bottom critical dimension 414.

The approximate point 416 at which each of the lines intersect indicates the approximate focus and exposure settings that were used to create the mark that included the two patterns. By having two patterns, a more precise setting can be determined. Specifically, the use of different marks with different densities acts as a cross verification process. This cross verification process can be used to determine the estimated fitting error. That way, an operator of the production equipment can determine the degree of accuracy with which the model has presented the focus and exposure settings used to create the mark. This estimated error can be useful for design, testing, and production purposes.

Figure 5A:
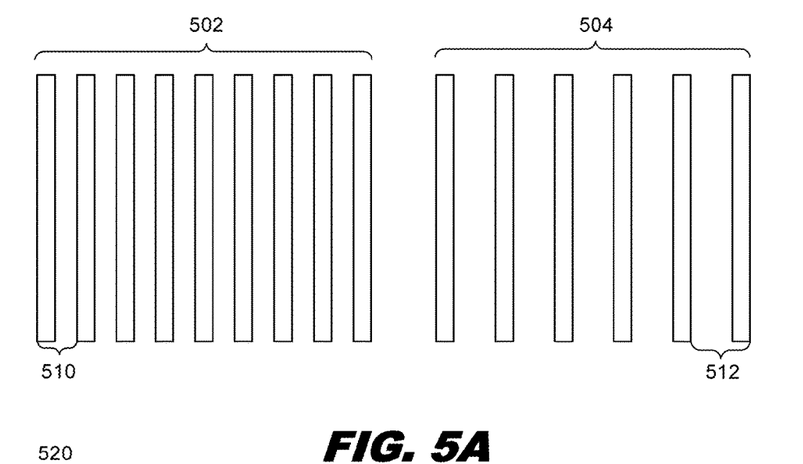
FIG. 5A is a diagram showing two illustrative patterns of different densities, according to one example of principles described herein.

FIG. 5A is a diagram showing two illustrative patterns of different densities. According to the present example, a first pattern 502 has a first density and a first pitch. Additionally, a second pattern 504 has a second density and a second pitch 512. These varying densities may be useful for obtaining multiple patterns to form and use the FEM model. However, use of such patterns involves two separate marks.

Figure 5B:
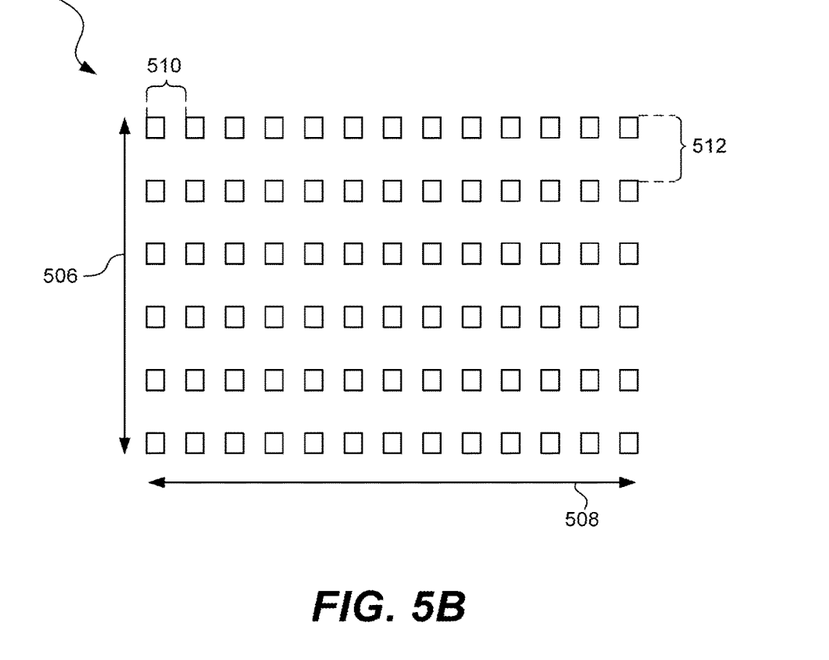
FIG. 5B is a diagram showing an illustrative two-dimensional mark with different densities along different cut-lines, according to one example of principles described herein.

FIG. 5B is a diagram showing an illustrative two-dimensional test mark 520 with different densities along different cut-lines. According to the present example, a single two-dimensional test mark includes two different patterns. Specifically, a pattern with one density is along the vertical axis 506 while a second pattern with a different density is along the horizontal axis 508. Thus, the pitch 510 along the horizontal axis 508 is different than the pitch 512 along the vertical axis. An optical measurement tool may be able to read the densities of both patterns. By combining multiple patterns into a single two-dimensional mark, the optical measurement tool can quickly measure two different patterns. This helps extract a more accurate FEM model at a faster rate.

Figure 6A:
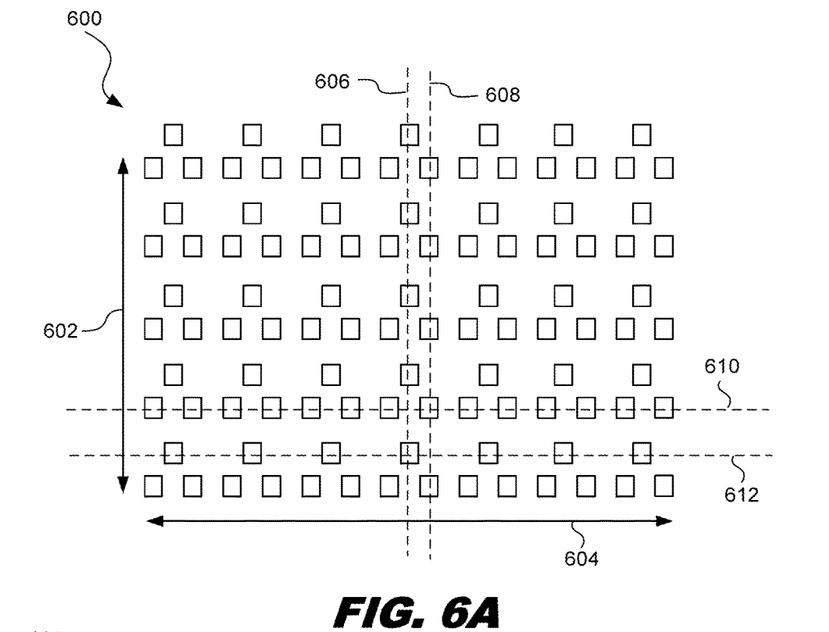
FIGS. 6A and 6B are diagrams showing illustrative two-dimensional marks having different densities along different cut-lines, according to one example of principles described herein.
Figure 6B:
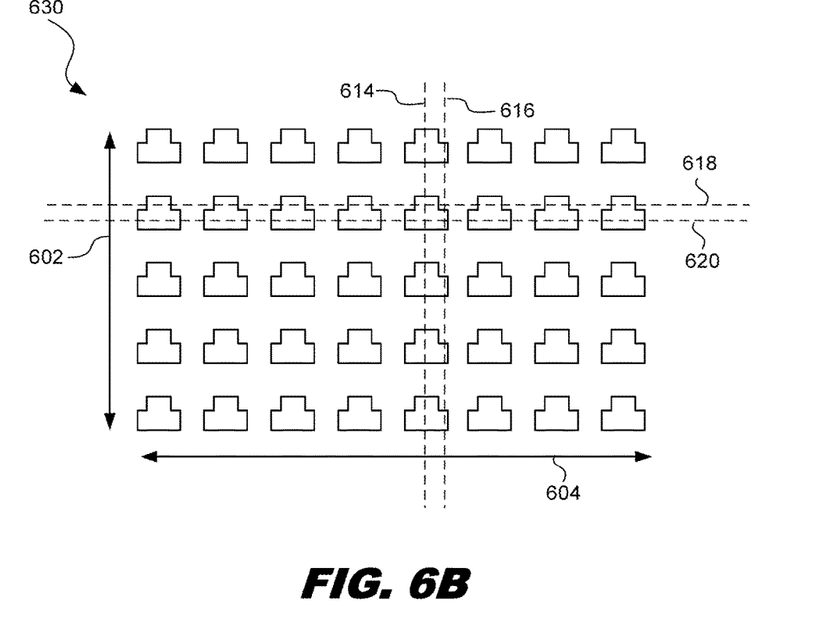

FIGS. 6A and 6B are diagrams showing illustrative two-dimensional test marks having different densities along different cut-lines. FIG. 6A illustrates a two-dimensional test mark 600 with multiple pattern densities in multiple directions. Specifically, there are two different patterns along the vertical axis 602. Likewise, there are two different pattern densities along the horizontal axis 604.

Along the vertical axis 602, two different cut lines 606, 608 are illustrated. The pattern at each of these cut-lines is the same density. Specifically, the spaces between features are the same for both patterns. While the pattern for one cut-line 606 is offset from the pattern of the other cut-line, the densities are the same. Thus, a scatterometer measuring along the vertical axis 602 may be able to identify one pattern density.

Along the horizontal axis 604, there are also two cut-lines 610, 612. Each of these cut-lines corresponds to a pattern of different densities. Specifically, the pattern of the first cut-line has a smaller density than the pattern of the second cut-line 612. Thus, a scatterometer measuring along the horizontal axis may be able to distinguish two different pattern densities. Moreover, for each pattern density, the scatterometer may be able to determine top critical dimension and bottom critical dimension for the features within the pattern.

FIG. 6B illustrates a two-dimensional test mark 630 having a number of asymmetrical features such that different cut-lines will exhibit different densities along different directions. Specifically, there are two different pattern densities along the horizontal axis 604. Likewise, there are two different pattern densities along the vertical axis 602.

The vertical cut-lines 614, 616 correspond to two different densities because the feature size along those cut lines is different. A scatterometer may be able to distinguish between the two pattern densities based on the spectra of incident light onto the test mark. Likewise, the horizontal cut-lines 618, 620 correspond to two different pattern densities along the horizontal direction.

The various test marks illustrated herein exhibit rotational asymmetry. That is, the pattern from one direction will be different than the pattern from another direction, particularly a perpendicular direction. Through such two-dimensional test marks. Multiple patterns with varying densities may be formed into a single two-dimensional mark. This allows the scatterometer to focus on a particular mark and obtain multiple pattern densities before moving on to a different test mark. This allows the FEM model to be extracted more efficiently.

Figure 7:
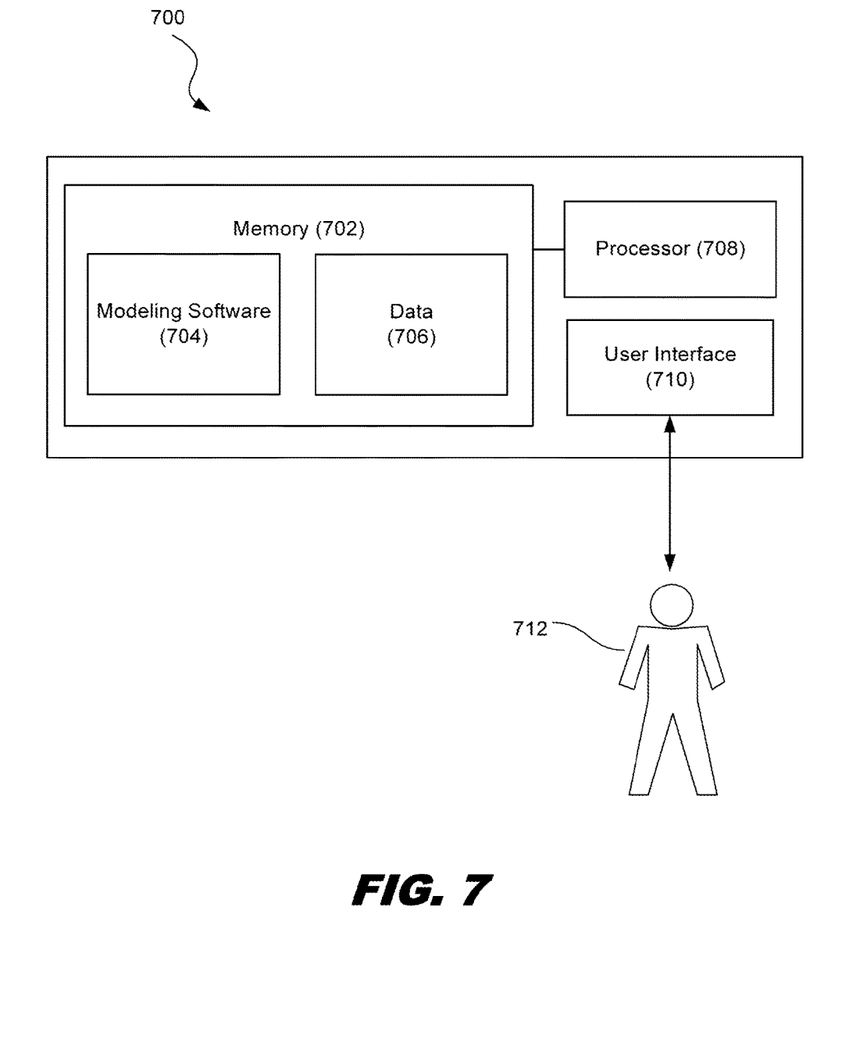
FIG. 7 is a diagram showing an illustrative computer system that may be used to form and use a FEM model based on two-dimensional marks, according to one example of principles described herein.

FIG. 7 is a diagram showing an illustrative computer system that may be used to form and use a FEM model based on two-dimensional test marks. According to certain illustrative examples, the physical computing system 700 includes a memory 702 having modeling software 704 and data 706 stored thereon. The physical computing system 700 also includes a processor 708 and a user interface 710.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 704 and data 706.

The physical computing system 700 also includes a processor 708 for executing the software 704 and using or updating the data 706 stored in memory 702. In addition to storing the modeling software 704, the memory 702 may store an operating system. An operating system allows other applications to interact properly with the hardware of the physical computing system.

The modeling software 704 may include the tools to form the FEM model based on the measurements obtained from the test substrate. Specifically, the modeling software 704 takes the measurements from the scatterometer of the features formed under varying focus and exposure conditions. The measurements can then be structured in a number of ways in order to form the FEM model. Specifically, various functions may be used to extrapolate additional data points from the existing discrete data points obtained through measurement.

A user interface 710 may provide a means for a user 712 to interact with the system. The user may use various tools such as a keyboard or a mouse to input information into the physical computing system. Additionally, various output devices such as a monitor may be used to provide information to the user 712.

Figure 8:
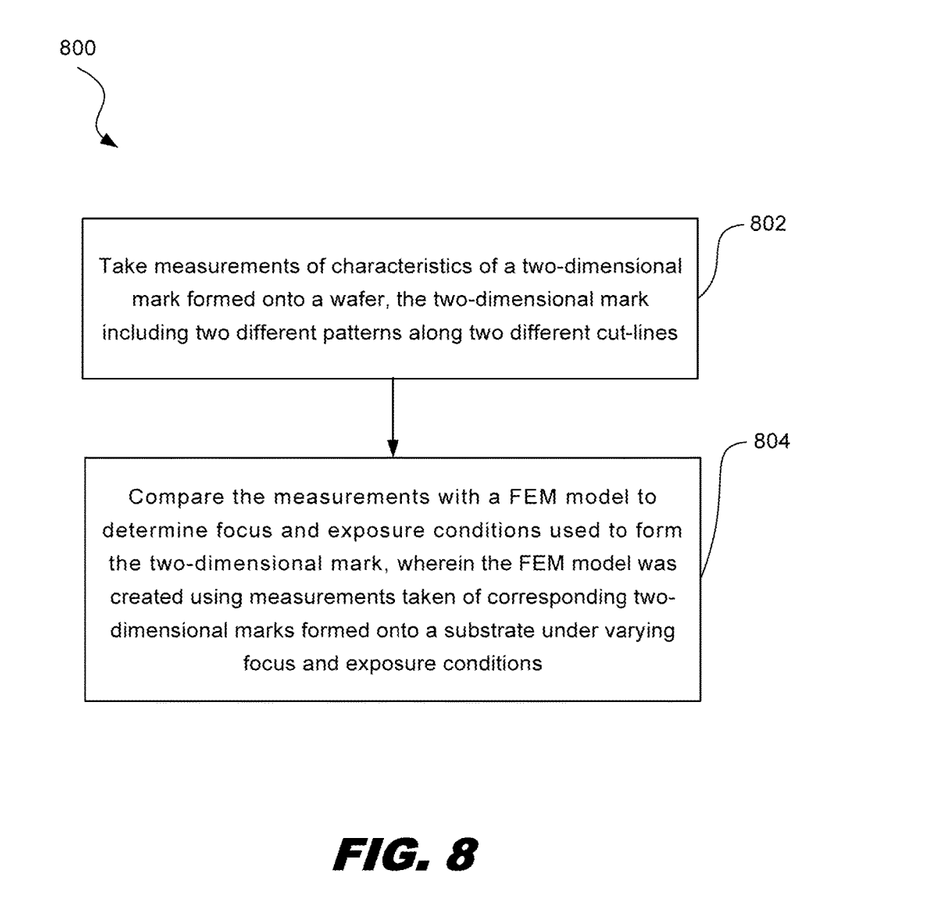
FIG. 8 is a flowchart showing an illustrative method for using a focus-exposure matrix model based on two-dimensional marks, according to one example of principles described herein.

FIG. 8 is a flowchart showing an illustrative method 800 for using a focus-exposure matrix model based on two-dimensional marks. According to certain illustrative examples, the method includes a step of taking 802 measurements of characteristics of a two-dimensional mark formed onto a substrate, the two-dimensional mark including two different patterns along two different cut-lines. The method further includes a step of comparing 804 the measurements with a FEM model to determine focus and exposure conditions used to form the two-dimensional mark, wherein the FEM model was created using measurements taken of corresponding two-dimensional marks formed onto a substrate under varying focus and exposure conditions.

According to certain illustrative examples, a method for controlling semiconductor production through use of a Focus Exposure Matrix (FEM) model includes taking measurements of characteristics of a two-dimensional mark formed onto a substrate, the two-dimensional mark including two different patterns along two different cut-lines, and comparing the measurements with a FEM model to determine focus and exposure conditions used to form the two-dimensional mark. The FEM model was created using measurements taken of corresponding two-dimensional marks formed onto a substrate under varying focus and exposure conditions.

According to certain illustrative examples, a computer system includes a processor and a memory. The memory includes a set of computer readable instructions that when executed by the processor, cause the system to receive measurements taken of characteristics of a two-dimensional mark formed onto a substrate, the two-dimensional mark including two different patterns along two different cut-lines, and compare the measurements with a FEM model to determine focus and exposure conditions used to form the two-dimensional mark. The FEM model was created using measurements taken of corresponding two-dimensional marks formed onto a substrate under varying focus and exposure conditions.

According to certain illustrative examples, a method for controlling production through use of a Focus Exposure Matrix (FEM) model includes, with an optical measurement tool, taking measurements of a set of two-dimensional marks formed on a first substrate, the set of two-dimensional marks being formed under varying focus and exposure conditions, and forming a FEM model of a relationship between focus, exposure, and the measurements taken by both the optical measurement tool. The method further includes taking measurements of a two-dimensional mark formed onto a production substrate, and using the FEM model and the measurements of the two-dimensional mark on the production substrate to determine focus and exposure conditions used to form features on the production substrate.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming first two-dimensional marks on a test substrate under varying focus and exposure conditions, wherein the first two-dimensions marks include a first pattern having a first density and a second pattern having a second density different from the first density, the first pattern and the second pattern being oriented along parallel cut-lines taken through the first two-dimensional marks;

measuring characteristics of the first pattern and the second pattern of the first two-dimensional marks, respectively, to form a focus exposure matrix (FEM) model;

forming second two-dimensional marks on a production substrate;

measuring characteristics of the second two-dimensional marks; and comparing the measured characteristics of the second two-dimensional marks with the FEM model to determine focus and exposure conditions used to form the second two-dimensional marks.

2. The method of claim 1, wherein the measured characteristics of the first two-dimensional marks are taken with a scatterometer.

3. The method of claim 1, further comprising, using the FEM model and the measured characteristics of the first two-dimensional marks to determine an optimal focus and exposure setting to achieve desired characteristics for marks to be formed on additional production substrates.

4. The method of claim 3, further comprising, adjusting the focus and exposure settings of photolithography equipment to optimal settings for formation of subsequent production substrates.

5. The method of claim 1, wherein the measuring of the characteristics of the first two-dimensional marks and the second two-dimensional marks includes measuring critical dimension.

6. The method of claim 5, wherein the measuring of the characteristics of the first two-dimensional marks and the second two-dimensional marks includes measuring a top critical dimension and a bottom critical dimension of the first and the second two-dimensional marks, respectively.

7. The method of claim 1, wherein the forming of the FEM model includes comparing the measured characteristics of the first pattern with the measured characteristics of the second pattern.

8. The method of claim 1, wherein the first two-dimensional marks include features having rotational asymmetry.

9. The method of claim 1, wherein the first two-dimensional marks include more than two patterns along more than two cut-lines.

10. A system comprising:
a test substrate having first two-dimensional marks disposed thereon, wherein the first two-dimensional marks include different patterns along cut-lines of a same direction taken through the first two-dimensional marks;
a production substrate having second two-dimensional marks disposed thereon;
an optical measurement tool configured to measure characteristics of the first and the second two-dimensional marks, respectively;
a processor; and
a memory including a set of computer readable instructions that when executed by the processor, is configured to:
receive measured characteristics of the second two-dimensional marks; and
compare the measured characteristics of the second two-dimensional marks with a focus and exposure matrix (FEM) model to determine focus and exposure conditions for forming the second two-dimensional marks,
wherein the FEM model is based on measured characteristics of the first two-dimensional marks.

11. The system of claim 10, wherein the measured characteristics of the first and the second two-dimensional marks include measurements of pitch of the first and the second two-dimensional marks.

12. The system of claim 10, wherein the memory is further configured to determine an optimal focus and exposure setting to achieve desired characteristics for two-dimensional marks to be formed on additional production substrates by using the FEM model.

13. The system of claim 10, wherein the measured characteristics of the first and the second two-dimensional marks include measurements of critical dimensions of the first and the second two-dimensional marks.

14. The system of claim 10, wherein the first two-dimensional marks include a first density along a first direction and a second density along a second direction that is perpendicular to the first direction.

15. The system of claim 10, wherein the first two-dimensional marks include first features having a first density and second features having a second density different from the first density along the same direction.

16. The system of claim 10, wherein the first two-dimensional marks include features having rotational asymmetry.

17. The system of claim 10, wherein the first two-dimensional marks include more than two patterns along more than two cut-lines.

18. A method comprising:
exposing a set of first two-dimensional marks on a first substrate under varying levels of exposure and focus conditions, wherein the set of first two-dimensional marks includes first features having a first density oriented along a first direction and second features having a second density oriented along a second direction similar to the first direction, and wherein the second density is different from the first density;
with an optical measurement tool, taking first measurements of the first features and second measurements of the second features, respectively;
forming a focus exposure matrix (FEM) model of a relationship between focus, exposure, the first measurements, and the second measurements;
taking third measurements of a set of second two-dimensional marks exposed on a second substrate;
using the FEM model and the third measurements to determine optimal focus and exposure conditions; and
exposing two-dimensional marks on subsequent substrate using the optimal focus and exposure conditions.

19. The method of claim 18, wherein features of the set of first two-dimensional marks include rotational symmetry.

20. The method of claim 18, wherein the taking of the first and the second measurements includes measuring critical dimensions of the first and the second features, respectively.

* * * * *